United States Patent [19]
Gruneisen

[11] Patent Number: 6,091,299
[45] Date of Patent: Jul. 18, 2000

[54] METHOD AND APPARATUS FOR ACHIEVING LINEARIZED RESPONSE OF PIN DIODE ATTENUATORS

[75] Inventor: Donald L. Gruneisen, Ramona, Calif.

[73] Assignee: Qualcomm Incorporated, San Diego, Calif.

[21] Appl. No.: 09/285,285

[22] Filed: Apr. 2, 1999

[51] Int. Cl.[7] ............................................. H03F 1/26
[52] U.S. Cl. .................... 330/149; 330/284; 333/81 R
[58] Field of Search .................................. 330/149, 284; 333/81 R, 81 A; 375/296; 455/63; 315/205

[56] References Cited

U.S. PATENT DOCUMENTS

| | | | |
|---|---|---|---|
| 3,944,876 | 3/1976 | Helmuth | 315/205 |
| 5,140,200 | 8/1992 | Stanton | 307/540 |
| 5,621,279 | 4/1997 | Nilssen | 315/247 |

*Primary Examiner*—Benny Lee
*Assistant Examiner*—Henry Choe
*Attorney, Agent, or Firm*—Philip R. Wadsworth; Gregory D. Ogrod

[57] ABSTRACT

The present invention is directed to a method and apparatus for linearizing the response of a PIN diode attenuator. A plurality of Zener diodes form a diode array. Each Zener diode has the same Zener voltage value. The cathode of a first Zener diode is coupled to an input of the diode array. The cathode of a second Zener diode is coupled to the anode of the first Zener diode. The cathode of each subsequent Zener diode is coupled to the anode of the preceding Zener diode. The anode of each Zener diode is coupled to a respective impedance. The respective impedances are further coupled in common to an output of the diode array. An amplifier provides gain and offset. The diode array output is coupled to the amplifier input. A driver provides output drive. The amplifier output is coupled to the driver input. The driver output is used for linearizing the response of a PIN diode attenuator.

16 Claims, 9 Drawing Sheets

METHOD AND APPARATUS FOR ACHIEVING LINEARIZED RESPONSE OF PIN DIODE ATTENUATORS

BACKGROUND OF THE INVENTION

I. Field of the Invention

The present invention relates to PIN diode attenuators, and more particularly to using a Zener diode array to linearize the response of a PIN diode attenuator.

II. Related Art

Automatic gain control circuits (AGC) generally are used to maintain a predetermined signal level at an output despite variations in the signal level at an input. Such circuits are used in a wide variety of electronic devices including radio and television receivers and other communication systems. In transmitting systems, such circuits are sometimes referred to as automatic level control (ALC) circuits. One example of an AGC circuit includes the use of an attenuator in a signal receiving circuit. In such systems, the attenuator operates to provide a relatively constant radio frequency (RF) signal output for a varying RF signal input by varying an impedance between the RF input and RF output.

A PIN diode attenuator is a commonly used circuit for providing such attenuation. A PIN diode attenuator is a device that provides a predetermined value of attenuation in a transmission line, in response to a precise value of bias. IEEE Standard Dictionary of Electrical and Electronics Terms, 4$^{th}$ Edition, IEEE, New York, N.Y. (1988). In other words, a PIN diode attenuator provides variable attenuation for a signal passing through it. A bias signal dictates how much attenuation is provided by the PIN diode attenuator. A PIN diode attenuator circuit generally includes multiple PIN diodes. A PIN diode is a diode with a large intrinsic region located between the p-n junction of the diode. This provides for a sharp knee in the PIN diode i-v characteristic curve.

During normal operation, a PIN diode attenuator is placed in the signal path of a signal receiving or transmitting circuit, and is used to provide variable attenuation for the level of the signal passing through it. The response of a conventional PIN diode attenuator is non-linear. The slope of a PIN diode attenuator response curve is related to the response time of the circuit. When the slope of the response curve varies over its length, the response times of the circuit at different points along the curve are different. The slope of the response of a PIN diode attenuator varies all along the curve. It is desired for the response curve of a PIN diode attenuator to be linear. What is needed is to achieve a range where the rate of change of attenuation (dB) with control voltage variation is a constant. This would provide for a more uniform response time for the attenuator within this range.

One way to create a linear response for a PIN diode attenuator is to combine it with another circuit, such that when their responses are combined, a linearized response results. Such a linearization circuit may be inserted into the feedback path of the signal transmitting or receiving circuit. One possible linearization circuit uses an analog-to-digital (A/D) converter to sample the feedback signal. The sampled value is used to access a ROM with a look-up table. The ROM maps out all of the feedback signal levels to the desired attenuation level. The ROM output is input to a digital-to-analog (D/A) converter, and fed back as a bias to the variable gain PIN diode attenuator. The A/D-ROM-D/A combination can be configured to create a response that, when combined with the non-linear response of a PIN diode attenuator, linearizes the response of the PIN diode attenuator. This approach, however, is complicated and requires a substantial number of circuit components or digital ICs to implement. It is desired to create a less complicated and less expensive linearization circuit.

Another approach for linearizing the response of a PIN diode attenuator uses an analog circuit inserted into the feedback path to emulate the desired linearization circuit response. One such approach uses an array of Zener diodes of incremental Zener voltage values, with as many Zener diodes as required by the particular application. The cathodes of the Zener diodes are coupled in common to the feedback signal. The anodes of the Zener diodes are coupled to respective resistors. The resistors are then coupled in common to the input of an amplifier. The output of the amplifier is coupled to the PIN diode attenuator bias point. The voltage values for the Zener diodes generally are chosen such that they increase in steps. For example, three Zener diodes in such a conventional Zener circuit may have voltage values of 3.3 V, 6.2 V, and 9.1 V, respectively. As the voltage level of the feedback signal increases, one diode turns on after the other. When a Zener diode turns on, its adjoining resistor affects the gain of the circuit. By calibrating all of these resistor values, the desired response for the circuit may be approximated.

This particular Zener diode circuit approach has limitations. Such a Zener diode circuit does not work consistently across variations in temperature. This is due primarily to differences in the temperature coefficients of different Zener diodes, in particular, zener diodes with different voltages. A plot of temperature coefficients shows that for Zener diodes with a voltage value of around 5.1V, the temperature coefficient is roughly zero. Hence, a 5.1 V Zener won't change its voltage much with variations in temperature. Zener diodes of voltages below 5.1 V, however, have a negative temperature coefficient. This means that as temperature increases, a Zener diode with a voltage value of less than 5.1 V will correspondingly decrease in voltage value. As temperature decreases, such a Zener diode will correspondingly increase in voltage value. Zener diodes with a voltage value greater than 5.1 V have a positive temperature coefficient. These Zener diodes will increase in voltage when temperature increases, and will decrease in voltage when temperature decreases. Thus, if Zener diodes with voltage values such as 3.3 V or 9.1 V are used, the voltage drops across the Zener diodes will vary with temperature. Such voltage variations will cause the slope of the response curve of the overall circuit to change with temperature variations. For instance, at ambient temperature, the Zener diode will produce a linearized response for the overall circuit. The slope of this linearized response, however, will become more or less steep with variations in the environmental temperature due to the temperature coefficients of the various Zener diodes involved. Changes in the slope of the response curve will adversely affect the gain of the overall circuit. Such variations in circuit performance are undesirable. What is needed is a feedback circuit that will provide a linearized response that is stable over a wide range of temperatures.

SUMMARY OF THE INVENTION

The present invention is directed to a method and apparatus for linearizing the response of a PIN diode attenuator. A plurality of Zener diodes form a diode array. Each Zener diode has the same Zener voltage value. A first Zener diode has a cathode coupled to an input of the diode array. A second Zener diode has a cathode coupled to the anode of the first Zener diode. Each subsequent Zener diode has a cathode coupled to the anode of the preceding Zener diode.

The anode of each Zener diode is coupled to a respective impedance. The respective impedances are further coupled in common to an output of the diode array.

An amplifier provides gain and offset. The diode array output is coupled to the amplifier input. A driver provides output drive. The amplifier output is coupled to the driver input. The driver output is used for linearizing the response of a PIN diode attenuator.

In a further aspect of the invention, the Zener diodes are selected to have a negative temperature coefficient. The diode array input is coupled to the diode array output by an impedance. The values of the impedances are selected such that the diode array has a linearizing response.

FEATURES AND ADVANTAGES

The present invention provides a method and apparatus for achieving linearized response of PIN diode attenuators.

The present invention further provides a method and apparatus for linearizing the response of PIN diode attenuators using a small number of inexpensive circuit components.

Still further, the present invention provides a method and apparatus for linearizing the response of PIN diode attenuators that does not change slope with variations of temperature. It beneficially provides a shift with temperature, while the circuit response remains linearized, that helps to correct for circuit gain shifts over temperature.

BRIEF DESCRIPTION OF THE FIGURES

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the left-most digit(s) in the corresponding reference number.

DETAILED DESCRIPTION OF THE PREFERRED EMBODIMENTS

1. Overview

The present invention is directed to a method and apparatus for achieving a linearized response for PIN diode attenuators. Generally speaking, the invention is useful for maintaining a constant attenuation (dB)/control voltage slope for a voltage-variable PIN diode attenuator, throughout its operating range and across wide temperature variations. The linearized response provides for a uniform response time in the variable gain amplification stage of a signal receiving or transmitting system.

The present invention allows a closed loop system to achieve a uniform AGC time constant. The present invention is placed in a feedback path to offset the non-linear attenuation (dB)/control voltage response of a PIN diode attenuator, providing for a linearized response. A cascaded array of identical, lower voltage Zener diodes are utilized to maintain a uniform response at all temperatures. The use of resistive taps between each of the diodes allows for gain correction at intermediate points in the operating range. The use of the Zener diode/resistor pairs allows the present invention to form a linear response for the attenuator stage of a communications system over a desired range. The diode array has a response curve approximating a desired linearizer circuit response. When placed in the feedback path, the response of the present invention is summed with the PIN diode attenuator response to approximate an ideal linearized response.

Due to the uniform temperature coefficient of some value Zener diodes, the linearized response will shift uniformly with decreases or increases in temperature from ambient. When using Zener diodes of voltage values below 5.1 V, their negative temperature coefficient has the benefit of correcting for circuit gain shifts over temperature. The gain of typical receiver or transmitter circuits increases at lower temperatures, and decreases at higher temperatures, due to gain level changes in the operation of amplifiers and other circuit components over temperature. The temperature characteristic of lower voltage Zener diodes aids in canceling this gain shift.

In a preferred embodiment, the linearization circuit includes a diode array, an amplifier stage to set gain and provide offset, and an output driver, and is used to linearize a PIN diode attenuator in a receiver circuit. For illustrative purposes, the invention is described herein with reference to this embodiment and others. It should be understood that the invention is not limited to these preferred embodiments. The invention is applicable to any application requiring the linearization of a PIN diode attenuator.

2. Conventional PIN Diode Attenuator and Receiver System

Figure 1:
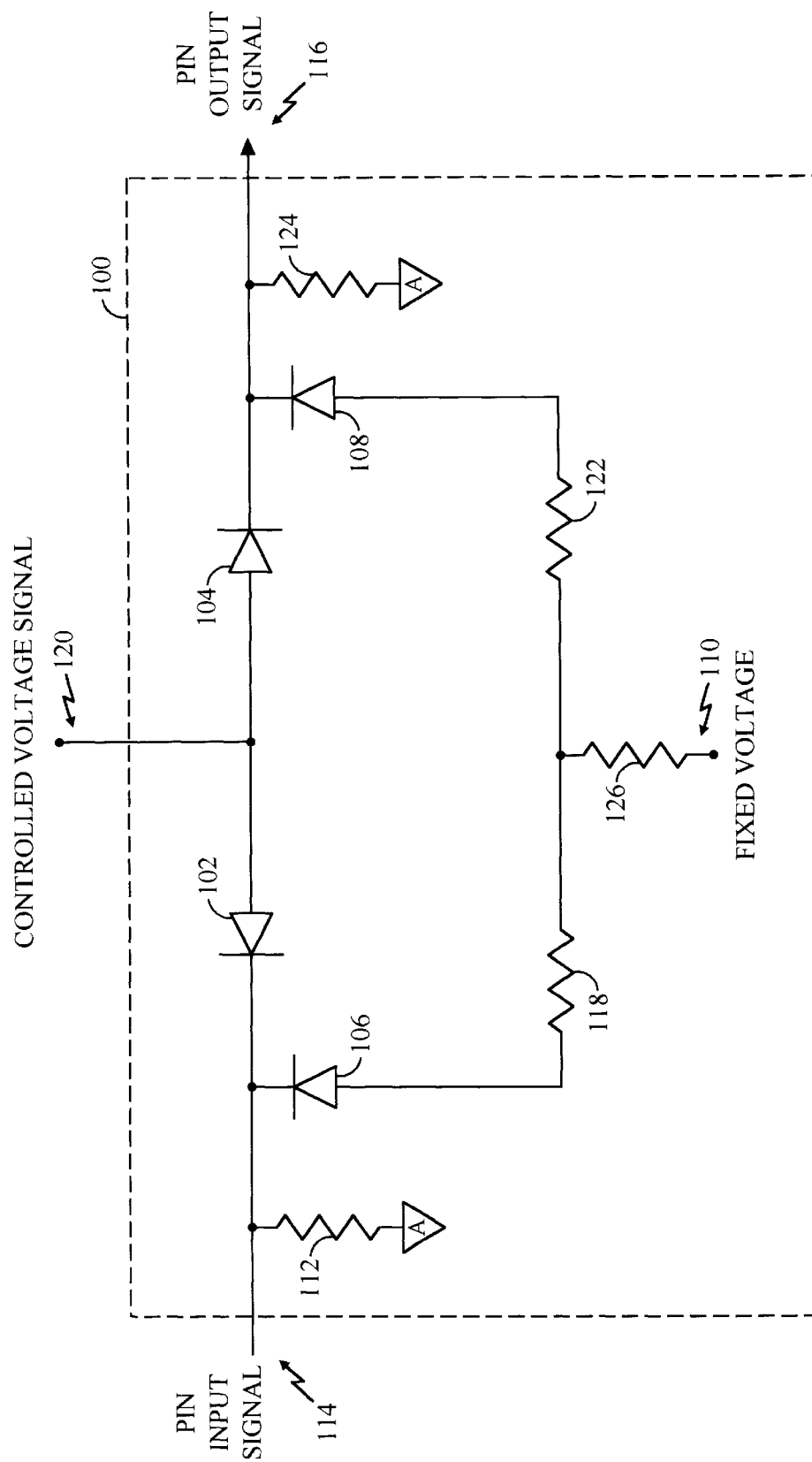
FIG. 1 is a circuit diagram of a conventional PIN diode attenuator circuit.

As described above, conventional receiver circuits frequently use PIN diode attenuators to provide automatic gain control. One example of a common PIN diode attenuator circuit 100 is shown in FIG. 1. Other PIN diode attenuator circuit configurations may be linearized by the present invention. PIN diode attenuator circuit 100 includes PIN diodes 102, 104, 106, and 108, and resistors 112, 118, 122, 124, and 126. The cathodes of PIN diodes 102 and 106, and the first terminal of resistor 112 are coupled in common to PIN input signal 114. The cathodes of PIN diodes 104 and 108, and the first terminal of resistor 124, are coupled in common to PIN output signal 116. The anodes of PIN diodes 102 and 104 are coupled in common to controlled voltage signal 120. The second terminals of resistors 112 and 124 are coupled to analog ground. The anodes of PIN diodes 106 and 108 are coupled to the first terminals of resistors 118 and 122, and first terminals of capacitors 126 and 128, respectively. The second terminals of resistors 118 and 122 are coupled in common to the first terminal of resistor 126. The second terminal of resistor 126 is tied to a fixed voltage 110. Fixed voltage 110 is held at a constant voltage level, generally in the 3–5 volt range.

For levels of controlled voltage signal 120 high enough to turn on diodes 102 and 104, PIN input signal 114 will have a path through the upper part of the attenuator circuit. Diodes 106 and 108 will be essentially shut off at these levels. Consequently, there will be less attenuation, and the gain of the attenuator circuit will be increased. As the level of controlled voltage signal 120 is decreased, diodes 102 and 104 will turn off, and diodes 106 and 108 will turn on. This will provide a shunt signal path through capacitors 126 and 128, which attenuate PIN input signal 114, lowering the gain of the circuit. In this manner, the level of controlled voltage signal 120 sets the level of attenuation provided.

Figure 2:
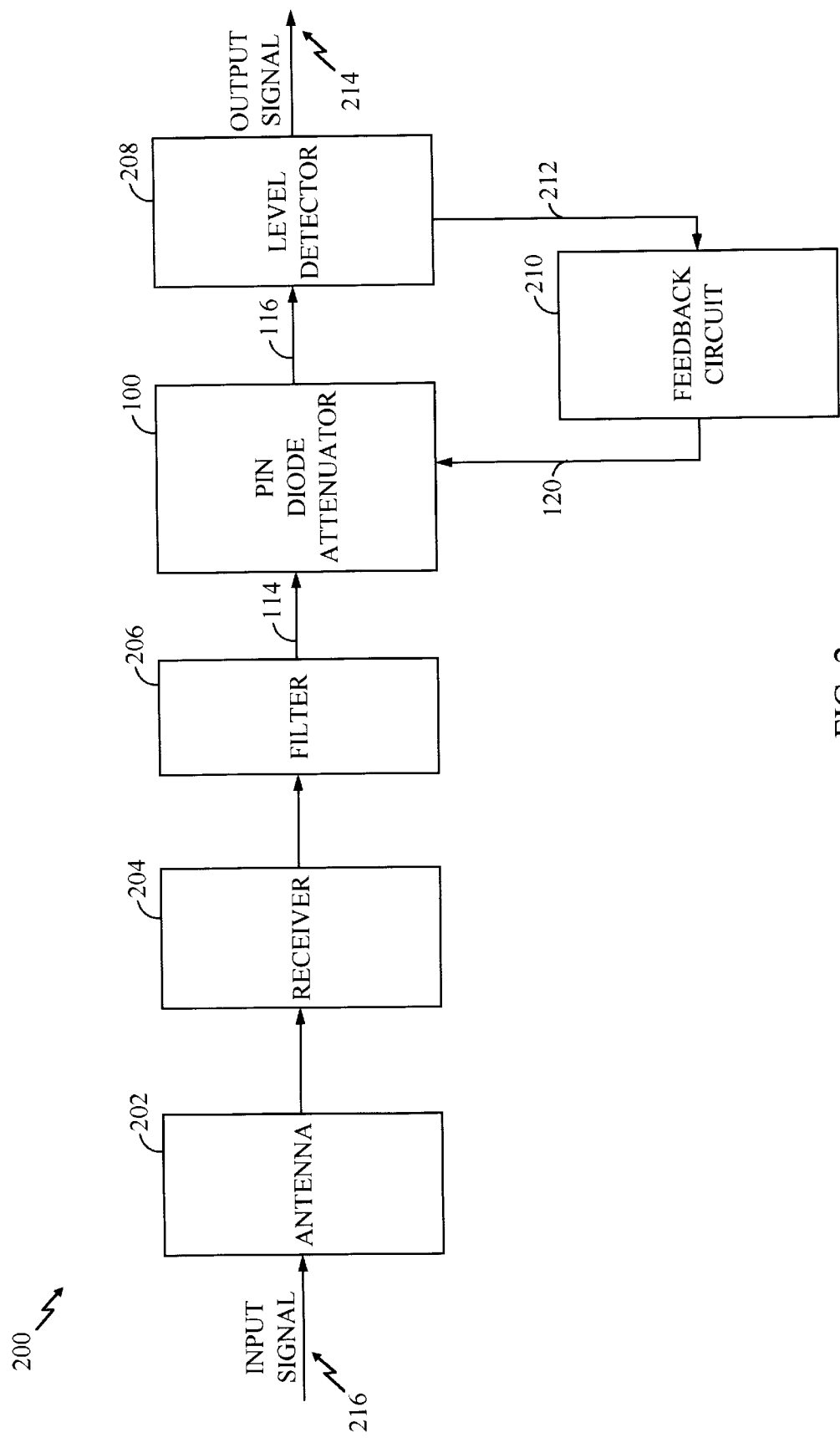
FIG. 2 is a block diagram of a conventional receiver apparatus.

During normal operation, PIN diode attenuator circuit 100 is placed in the signal path of a signal transmitting or receiving circuitry or circuits, and is used to provide variable attenuation for the level of the signal passing through. FIG. 2 shows a block diagram of a front end apparatus or tuner portion 200 of conventional receiver apparatus. Front end apparatus 200 includes an antenna 202, receiver 204, filter 206, PIN diode attenuator circuit 100, level detector 208, and feedback circuit 210.

Antenna 202 intercepts an input signal 216. Receiver 204 is used to tune to and receive input signal 216 and apply gain or perform frequency band conversion as desired. Filter 206 is used to remove noise from the signal passing through, outputting PIN input signal 114. PIN diode attenuator circuit 100 inputs PIN input signal 114 from filter 206. PIN diode attenuator 100 attenuates PIN input signal 114 as dictated by the bias level of controlled voltage signal 120, and outputs PIN output signal 116. Level detector 208 detects a level on PIN output signal 116, and outputs level detector feedback signal 212 and output signal 214. In an exemplary embodiment, an A/D converter element or circuit is used to form level detector 208. However, those skilled in the art will readily recognize that other known types of level detectors can be used within the teachings of the present invention. Feedback circuit 210 inputs level detector feedback signal 212, and outputs controlled voltage signal 120.

A threshold voltage level is set in level detector 208, so that when the level of input signal 216 rises, the attenuation of the variable gain stage, PIN diode attenuator 100, adjusts to maintain a level on output signal 214, such that output signal 214 fits into the input window of an A/D converter (when used) sampling its value. For example, tuner apparatus 200 may need to increase its gain to increase signal level. In the condition where received input signal 216 is very low, tuner apparatus 200 will need to boost signal level. If there is a condition where input signal 216 is relatively stronger, front end apparatus 200 may need to reduce the gain. The increase and decrease of gain is achieved by varying the bias to PIN diode attenuator 100. Controlled voltage signal 120 is adjusted, providing for gain control.

Level detector feedback signal 212, and, thus, controlled voltage signal 120 output by feedback circuit 210, is used to control the adjustment of the attenuation of PIN diode attenuator 100. These circuit elements form a feedback loop. The response time of the feedback loop is set by the sensitivity of level detector 208, feedback circuit 210, the slope of the response of variable gain PIN diode attenuator 100, and the time constants associated with these elements.

Figure 3:
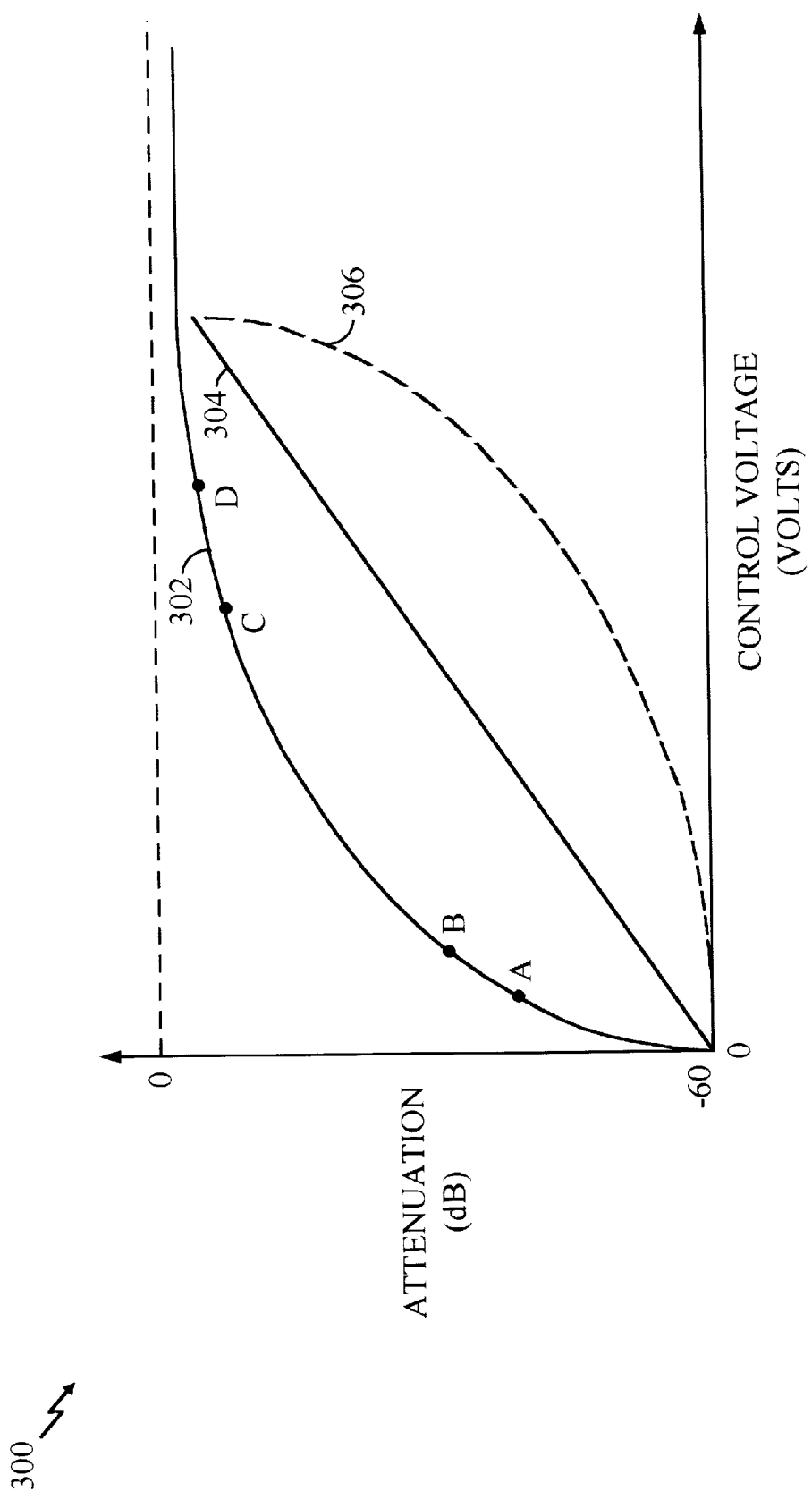
FIG. 3 is a graph showing the response curve of a PIN diode attenuator without correction, a desired linear response of a PIN diode attenuator, and the desired response curve for a feedback circuit.

FIG. 3 is a graph showing response curves of a PIN diode attenuator 100 in a feedback loop, showing attenuation in decibels (dB) across a range of voltage values for controlled voltage signal 120. PIN diode attenuator response 302 shows the response curve of a PIN diode attenuator 100, with feedback circuit 210 acting as a short circuit between level detector feedback signal 212 and controlled voltage signal 120. As shown in response 302, as the voltage level of controlled voltage signal 120 is increased, the attenuation effected by PIN diode attenuator circuit 100 is decreased. For example, as shown in FIG. 3, at a level of 0 V on controlled voltage signal 120, attenuation may be roughly −60 dB. As the voltage level on controlled voltage signal 120 is increased, attenuation reaches nearly 0 dB. By varying the level of controlled voltage signal 120, the attenuation provided by PIN diode attenuator circuit 100 correspondingly varies, providing for gain control.

As shown in FIG. 3, PIN diode attenuator response 302 is non-linear. It is desired for the response curve of PIN diode attenuator circuit 100 to be linear. For example, in a circuit implementing automatic gain control, such as front end apparatus 200, apparatus 200 may receive a level change on input signal 216. This level change on input signal 216 may necessitate an adjustment in the level of controlled voltage signal 120 to change the gain of the circuit. On the curve of PIN diode attenuator response 302, this could entail a change from point A to point B, or from point C to point D. The slope of the curve of PIN diode attenuator response 302 has one value between point A and point B, and another value between point C and point D. The time constant of the feedback loop is different within these two ranges, causing more time to be required to move along the curve from point A to point B than from point C to point D. The slope of PIN diode attenuator response 302 varies all along the curve.

A desired PIN diode attenuator response curve is shown in FIG. 3 as ideal response 304. Ideal response 304 has a constant slope, and, therefore, a uniform time constant. One way to create such a curve is to create a circuit with a response, such that when it is combined with the response of PIN diode attenuator circuit 100, a more constant rate of change is provided. The response of such a circuit is shown as desired linearizer response 306. When PIN diode attenuator response 302 and desired linearizer response 306 are summed, a curve similar to ideal response 304 is produced. The present invention approximates desired linearizer response 306, linearizing the response of PIN diode attenuator 100.

3. Conventional Zener Diode Linearization Circuit

Figure 4:
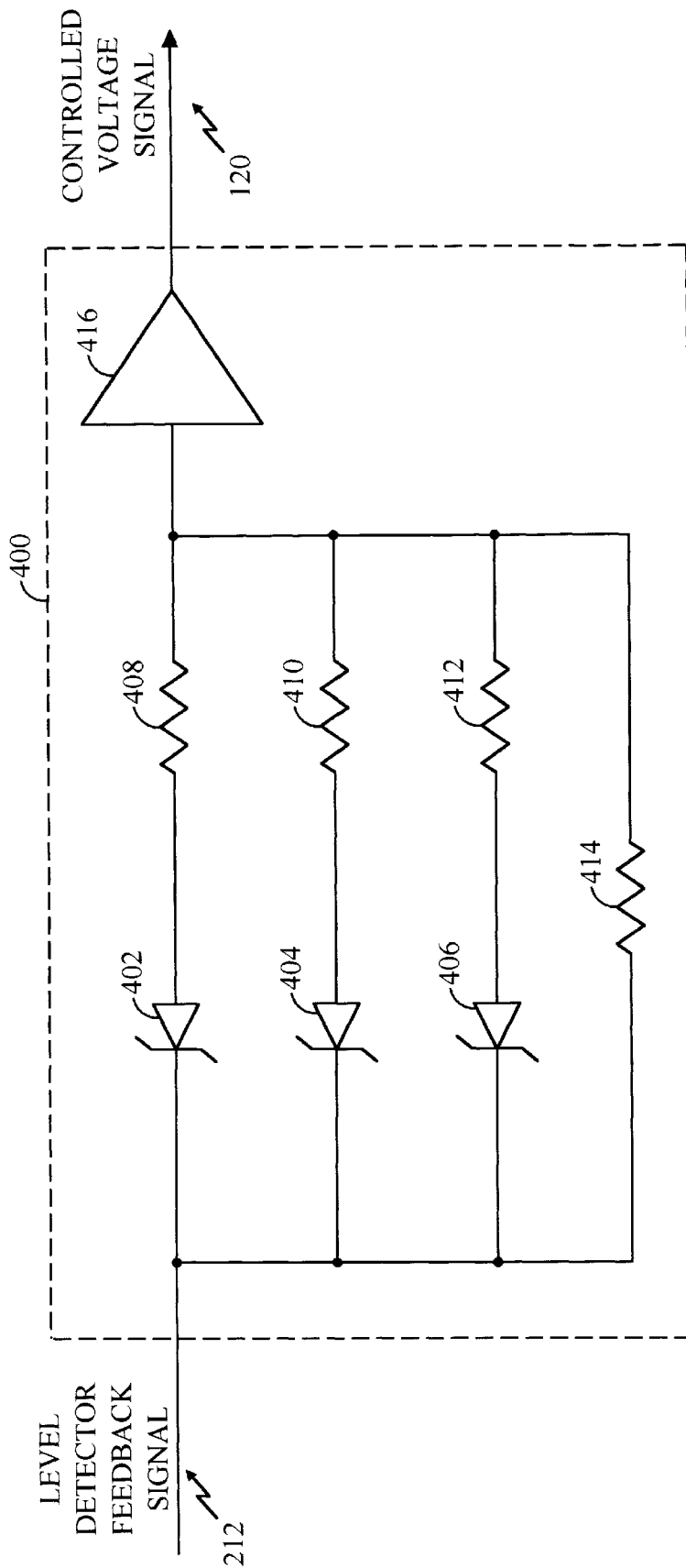
FIG. 4 is a circuit diagram of a conventional circuit used to linearize the response of a PIN diode attenuator.

In FIG. 4, a conventionally used analog circuit described above that uses Zener diodes to linearize the response of PIN diode attenuator 100 is shown. The cathodes of Zener diodes 402, 404, and 406 are coupled in common to level detector feedback signal 212, along with the first terminal of resistor 414. The anodes of Zener diodes 402, 404, and 406 are coupled to the first terminals of corresponding resistors 408, 410, and 412. The second terminals of resistors 408, 410, 412, and 414 are coupled in common to the input of amplifier 416. The output of amplifier 416 is coupled to controlled voltage signal 120.

For example, Zener diodes 402, 404, and 406 in conventional Zener circuit 400 may have voltage values of 3.3 V, 6.2 V, and 9.1 V, respectively. For voltage levels of level detector feedback signal 212 beginning at 3.3 V, the gain of the circuit is affected by the signal running through Zener diode 402 and its respective resistor 408. As the voltage level of level detector feedback signal 212 increases further, subsequent Zener diodes 404 and 406 turn on, and subsequent resistors 410 and 412 set the gain level for the circuit. By calibrating all of these resistor values, the desired response for the circuit may be approximated. As described above, this conventional approach suffers from problems when there are temperature variations. The present invention solves these problems, retaining the same attenuation/control voltage slope across temperature.

4. Structure and Operation of the Invention

Figure 5:
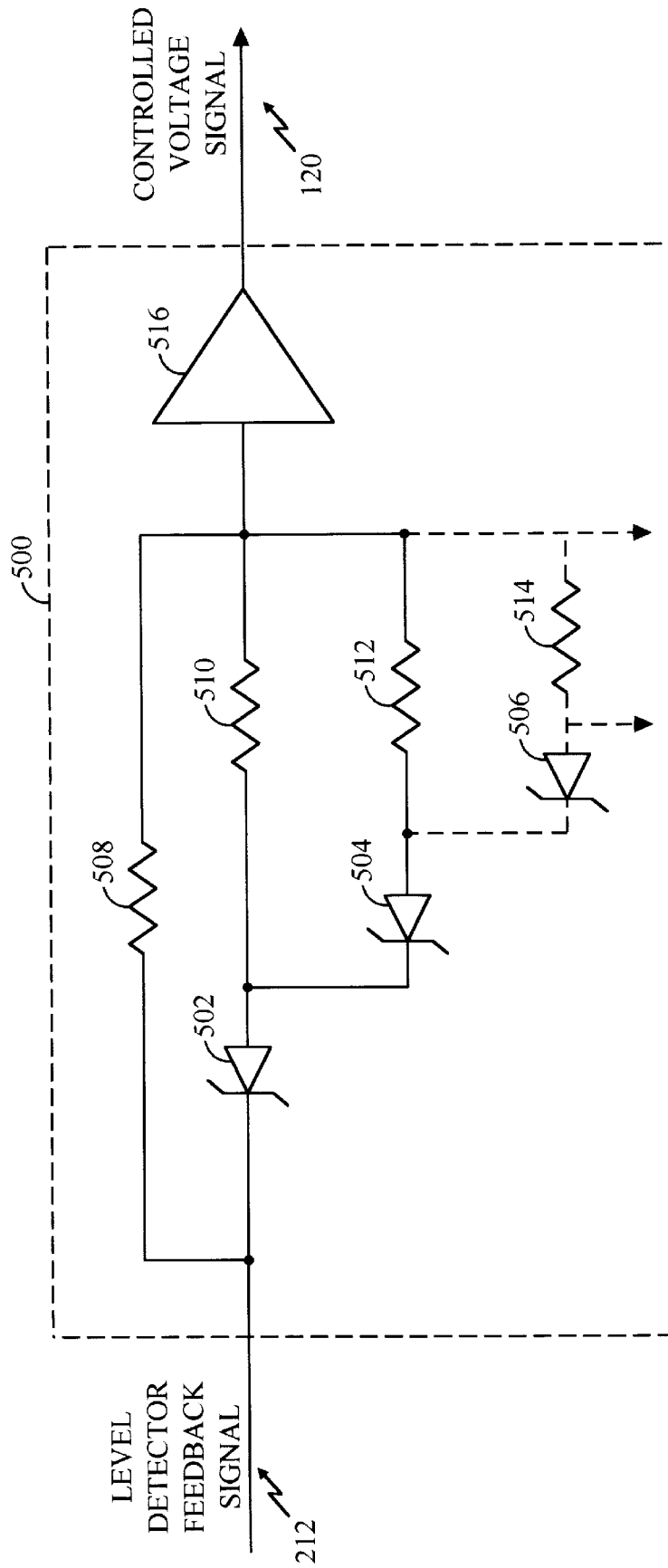
FIG. 5 is a circuit diagram of a PIN diode attenuator linearizer according to the present invention.

FIG. 5 illustrates a linearization circuit 500 according to a preferred embodiment of the present invention. Linearization circuit 500 may be used in place of feedback circuit 210 shown in FIG. 2 to linearize the response of PIN diode attenuator circuit 100 in front end apparatus 200. Likewise, linearization circuit 500 may be used to linearize the response of a PIN diode attenuator circuit in a transmitter apparatus. As shown in FIG. 5, linearization circuit 500 generally is implemented in the form of discrete components and analog integrated circuits (ICs). Other ways of implementing linearization circuit 500 will be apparent to one skilled in the art, and are within the scope of the present invention.

Linearization circuit 500 includes Zener diodes 502 and 504, resistors 510 and 512, and an amplifier 516. Linearization circuit 500 may also include a Zener diode 506 and a resistor 514, and further Zener diode/resistor pairs. Additionally, linearization circuit 500 may include a resistor 508. Linearization circuit 500 receives level detector feedback signal 122, and outputs controlled voltage signal 120.

The cathode of Zener diode 502 is coupled to level detector feedback signal 212. The first terminal of an impedance, resistor 510, is coupled to the anode of Zener diode 502. The cathode of a second Zener diode, Zener diode 504, is also coupled to the anode of Zener diode 502. Zener diode 504 has the same Zener voltage value as Zener diode 502. The first terminal of an impedance, resistor 512, is coupled to the anode of Zener diode 504. The second terminals of resistors 510 and 512 are coupled in common to the output of the diode array, which is further coupled to the input of amplifier 516.

Zener/resistor pairs 502 and 510, and 504 and 512, together provide a response that can be used to linearize PIN diode attenuator circuit 100 over a particular range. For example, if a Zener voltage of 3.3 volts is chosen for the Zener diodes, the linearization circuit will be capable of approximating a linearized response across the range of at least 3.3 V to 6.6 V. A signal on level detector feedback signal 212 of approximately 3.3 V will cause Zener diode 502 to begin conducting. A signal on level detector feedback signal 212 of approximately 6.6 V will cause Zener diode 504 to begin conducting. The linearization at the endpoints of this range will be affected by the characteristics of the particular Zener diodes used in the application, and the circuit being linearized. It will be apparent to one skilled in the art how to determine suitable Zener diodes for the particular application.

Because the Zener diodes included in the diode array are of the same voltage value, they will continue to provide a linearized response over a range of temperatures. This characteristic is due to using Zener diodes with the same temperature coefficient, causing the Zener diodes to react uniformly to temperature changes.

For Zener diodes of voltage values less than 5.1 V, the temperature coefficient is negative. Hence, the Zener diode voltages will decrease with increases of temperature, and vice versa. This causes the response curve of the diode array to shift with changes in temperature. For example, desired linearizer response 306 approximated by the circuit will shift downward when temperature decreases from ambient, and will shift upward when temperature increases from ambient. As a result, ideal response 304 approximated by the circuit will correspondingly shift downward or upward due to decreases or increases in temperature from ambient. This characteristic has the benefit of aiding in correcting the typical condition or problem of lower RF/IF (intermediate frequency) gain when hot due to the heating of circuit components, and higher RF/IF gain when cold. A reverse effect occurs for Zener diodes of voltage values greater than 5.1 V.

Subsequent Zener/resistor pairs may be included to provide a linearized response over a broader range of controlled voltage signal 120. As shown in FIG. 5, the cathode of Zener diode 506 may be connected to the anode of Zener diode 504, and the first terminal of resistor 514 may be coupled to the anode of Zener diode 506. Zener diode 506 is of the same Zener voltage value as Zener diodes 502 and 504. The second terminal of resistor 514 is coupled to the output of the diode array. Further Zener/resistor pairs may be included, in the same fashion as previous Zener/resistor pairs. The cathode of each subsequent Zener diode is coupled to the anode of the preceding Zener diode, and the anode of each subsequent Zener diode is coupled to a respective impedance. Each of the respective impedances are then further coupled in common to an output of the diode array. The number of Zener/resistor pairs required will depend on the particular application. It will be apparent to one skilled in the art how to determine the proper number of Zener/resistor pairs to use in a particular application.

The values of the impedances used in each Zener/resistor pair are selected to provide the gain levels required by the particular application. It will be apparent to one skilled in the art how to select proper impedance values. In an alternative embodiment, one or more of the impedance values may be selected to be a zero value or to be replaced by a short circuit. Additionally, resistor 508 may be coupled to level detector feedback signal 212 and to the output of the diode array. Resistor 508 may be inserted in a particular application if it is desired to linearize the response at voltage levels of controlled voltage signal 120 below the point where the first Zener diode turns on. The response of linearization circuit 500 may be tailored in this way to form a curve approximating desired linearizer response 306 in FIG. 3, to linearize PIN diode attenuator response 302, forming ideal response 304.

The input of amplifier 516 is coupled to the output of the diode array. Amplifier 516 may be included when necessary to provide gain, offset, and output drive to the diode array output signal. Amplifier 516 preferably includes operational amplifiers to provide gain, offset, and output drive. Amplifier 516 may additionally include transistors to provide increased output drive. Other implementations for amplifier 516 are within the scope of the invention. It will be apparent to one skilled in the art how to configure an amplifier 516 for a particular application.

5. Receiver Circuit Embodiment

Figure 6:
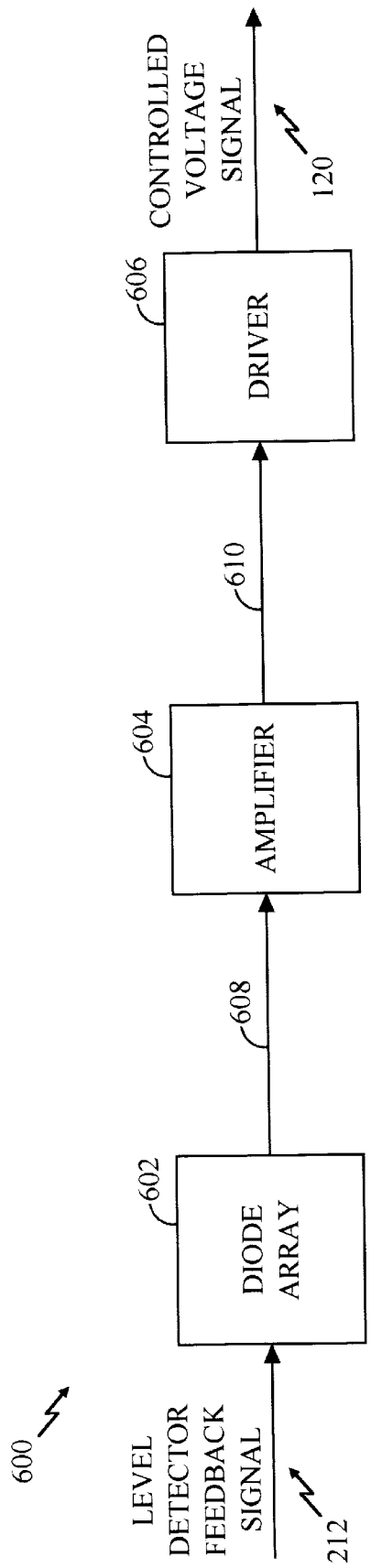
FIG. 6 is a block diagram of a PIN diode attenuator linearization apparatus according a preferred embodiment of the present invention.

FIG. 6 illustrates a linearization apparatus 600 used for linearizing the response of a PIN diode attenuator in a receiver circuit, according to a preferred embodiment of the present invention. Linearization apparatus 600 includes a diode array 602, an amplifier 604, and an output driver 606. Linearization apparatus 600 inputs a level detector feedback signal 212, and outputs a controlled voltage signal 120.

Figure 7:
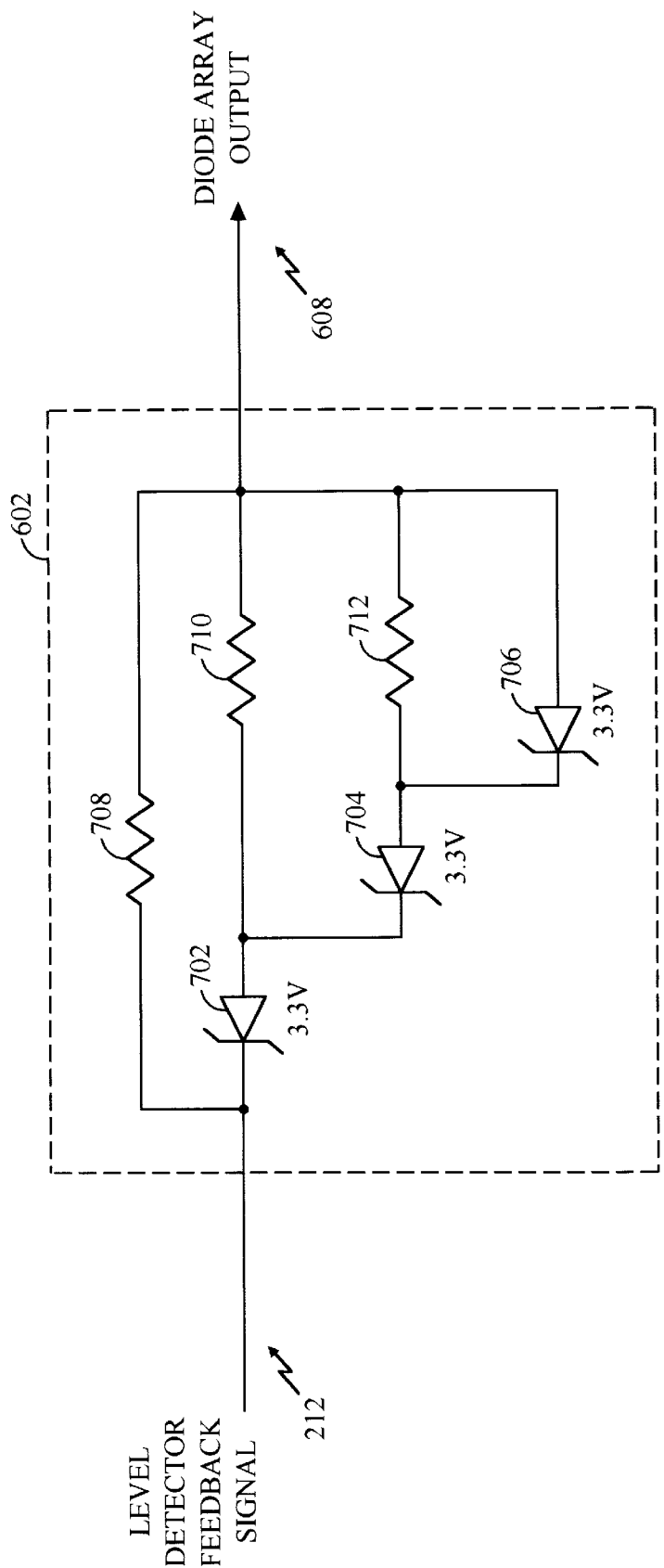
FIG. 7 is a circuit diagram of a diode array according to a preferred embodiment of the present invention.

FIG. 7 shows a circuit diagram of diode array 602 according to a preferred embodiment of the present invention. Diode array 602 includes Zener diodes 702, 704, and 706, and resistors 708, 710, and 712. Diode array 602 receives level detector feedback signal 212, and outputs diode array output 608.

The cathode of Zener diode 702 is coupled to level detector feedback signal 212. The first terminal of an impedance, resistor 710, is coupled to the anode of Zener diode 702. The cathode of a second Zener diode, Zener diode 704, is also coupled to the anode of Zener diode 702. The first terminal of an impedance, resistor 712, is coupled to the anode of Zener diode 704. The cathode of a third Zener diode, Zener diode 706, is coupled to the anode of Zener diode 704. The second terminals of resistors 710 and 712, and the anode of Zener diode 706, are coupled in common to the diode array output 608.

In this preferred embodiment, three Zener diodes and their respective impedances are used to linearize the response of the PIN diode attenuator circuit. Zener diodes 702, 704, and 706 all have the same Zener voltage value of 3.3 V. Similarly to the diode configuration shown in FIG. 5, Zener diodes 702 and 704 are coupled to respective impedances, resistors 710 and 712. The values of these impedances are selected to affect the circuit gain when their respective Zener diodes are turned on. Zener diode 706 is not coupled to a respective impedance in diode array 602. This arrangement relates to the circuit shown in FIG. 5, in the situation where the value of resistor 514 zero. In the preferred embodiment shown in FIG. 7, an impedance coupled to Zener diode 706 in diode array 602 is not required. As will be discussed below, Zener diodes 702 and 704 and their respective impedances, and Zener diode 706, act with a further circuit impedance to affect the circuit gain.

As shown in FIG. 6, diode array output 608 is input to amplifier 604. Amplifier 604 is preferably an operational amplifier configured with discrete components, such as resistors and capacitors, to provide gain and offset. It will be apparent to one skilled in the art how to properly configure an operational amplifier for a particular application. The output of amplifier 604 is amplifier output signal 610. Amplifier output signal 610 is input to driver 606. In a preferred embodiment, driver 606 is a transistor used to provide output drive. It will be apparent to one skilled in the art how to properly configure an transistor for a particular application.

In actual operation, as the voltage level of level detector feedback signal 212 increases from zero, one diode turns on after the other. Resistor 708 controls the gain of the circuit at the lowest voltage levels. For voltage levels of level detector feedback signal 212 beginning at approximately 3.3 V, Zener diode 702 begins to turn on, and the gain of the circuit is affected by the signal running through resistor 708. As the voltage level of level detector feedback signal 212 increases further to approximately 6.6 V, Zener diode 704 begins to turn on, and the gain of the circuit is affected by the signal running through resistor 712. As the voltage level of level detector feedback signal 212 increases further to approximately 9.9 V, Zener diode 706 begins to turn on. By calibrating the resistor values, the desired response for the circuit, desired linear response 306 shown in FIG. 3, may be approximated.

Figure 8:
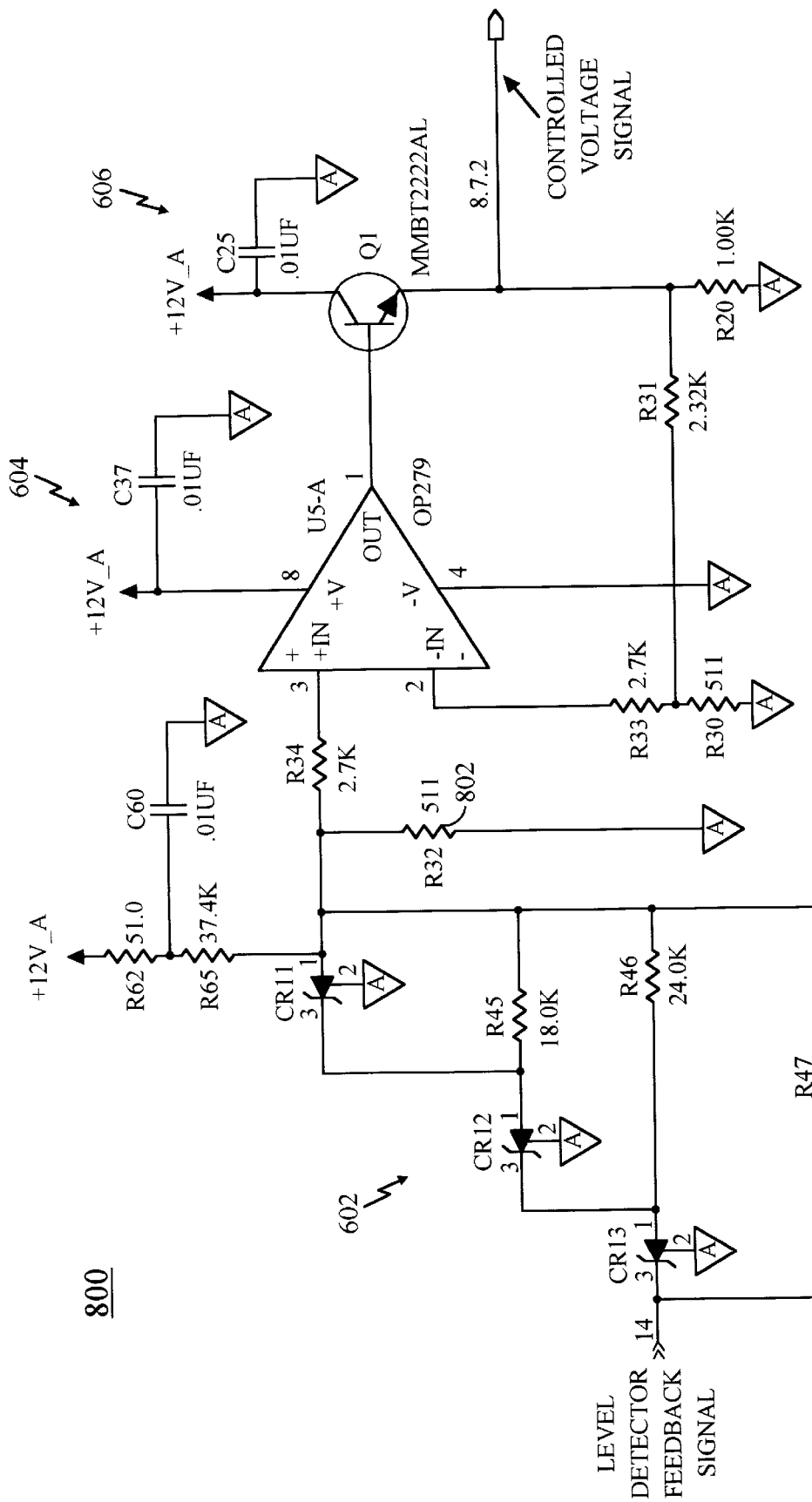
FIG. 8 is a detailed circuit diagram of the block diagram of FIG. 6, of a preferred embodiment of a PIN diode attenuator linearization circuit.

FIG. 8 shows a complete linearization circuit 800, which is a detailed circuit diagram of linearization apparatus 600. The major regions of FIG. 8 relating to diode array 602, amplifier 604, and output driver 606 are indicated. In this preferred embodiment, resistor 802 forms a voltage divider with the gain resistors of diode array 600. As each subsequent Zener diode of diode array 602 turns on, its respective resistor forms a voltage divider with resistor 802, affecting the gain of the circuit.

Figure 9:
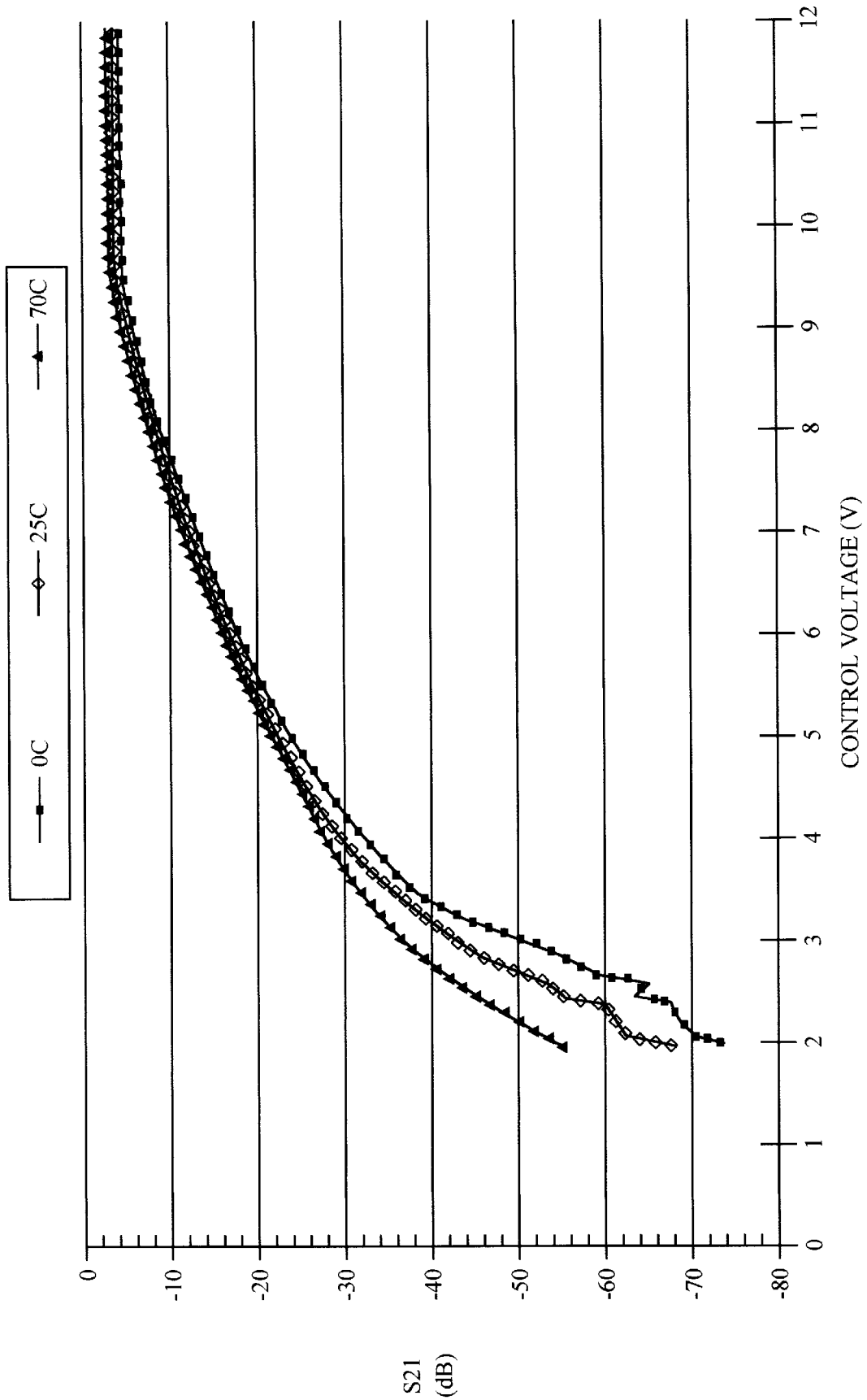
FIG. 9 is a graph of the response of a PIN diode attenuator summed with the linearization circuit of FIG. 8, at 0 degrees, 25 degrees, and 70 degrees Celsius, according to a preferred embodiment of the present invention.

FIG. 9 shows a graph of the response of a PIN diode attenuator circuit 100 summed with complete linearization circuit 800 of FIG. 8. The graph shows a linearized response for attenuation (dB) versus control voltage, at three different temperature levels of 0° C., 25° C., and 70° C. As described above, when environmental temperature increases, the attenuation (dB)/control voltage curve remains linearized across the control voltage range of interest, and shifts toward 0 dB of attenuation.

6. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. For example, the linearization circuit may be used to linearize a PIN diode attenuator used in a receiver, transmitter, or other communications circuit. Thus, the breadth and scope of the present invention should not be limited by any of the above-described exemplary embodiments, but should be defined only in accordance with the following claims and their equivalents.

What I claim as my invention is:

1. An apparatus for linearizing the response of a PIN diode attenuator, comprising:

a plurality of Zener diodes forming a diode array, each of said Zener diodes having the same Zener voltage value, a first Zener diode having cathode coupled to an input of the diode array, a second Zener diode having a cathode coupled to the anode of said first Zener diode, the anode of each of said Zener diodes being coupled to a respective impedance, said respective impedances being coupled in common for connection to a controlled voltage source of a PIN diode attenuator for linearizing the response of the PIN diode attenuator.

2. The apparatus of claim 1, further comprising:

at least one additional Zener diode, said at least one additional Zener diode having the same Zener voltage value as said first and said second Zener diodes, said at least one additional Zener diode having a cathode coupled to the anode of the preceding Zener diode, the anode of said at least one Zener diode being coupled to a respective impedance, said respective impedances being coupled in common for connection to said controlled voltage source of said PIN diode attenuator.

3. The apparatus of claim 2, wherein said Zener diodes are selected to have a negative temperature coefficient.

4. The apparatus of claim 3, further comprising an impedance coupling said diode array input to an output of said diode array.

5. The apparatus of claim 4, wherein the values of said impedances are selected such that the diode array has a linearizing response.

6. An apparatus for linearizing the response of a PIN diode attenuator, comprising:

a plurality of Zener diodes forming a diode array, each of said Zener diodes having the same Zener voltage value, a first Zener diode having a cathode coupled to an input of the diode array, a second Zener diode having a cathode coupled to the anode of said first Zener diode, each subsequent Zener diode having a cathode coupled to the anode of the preceding Zener diode, the anode of each of said Zener diodes being coupled to a respective impedance, said respective impedances being coupled in common to an output of said diode array; and an amplifier providing gain, offset, and output drive, said diode array output being coupled to an input of said amplifier, and an output of said amplifier being used for linearizing the response of the PIN diode attenuator.

7. The apparatus of claim 6, wherein said Zener diodes are selected to have a negative temperature coefficient.

8. The apparatus of claim 7, wherein said diode array further comprises an impedance coupling said diode array input to said diode array output.

9. The apparatus of claim 8, wherein the values of said impedances are selected such that the diode array has a linearizing response.

10. An apparatus for linearizing the response of a PIN diode attenuator, comprising:

a plurality of Zener diodes forming a diode array, each of said Zener diodes having the same Zener voltage value, a first Zener diode having a cathode coupled to an input of the diode array, a second Zener diode having a cathode coupled to the anode of said first Zener diode, each subsequent Zener diode having a cathode coupled to the anode of the preceding Zener diode, the anode of each of said Zener diodes being coupled to a respective impedance, said respective impedances being coupled in common to an output of said diode array;

an amplifier providing gain and offset, said diode array output being coupled to an input of said amplifier; and a driver providing output drive, an output of said amplifier being coupled to an input of said driver, an output of said driver being used for linearizing the response of a PIN diode attenuator.

11. The apparatus of claim 10, wherein said Zener diodes are selected to have a negative temperature coefficient.

12. The apparatus of claim 11, wherein said diode array further comprises an impedance coupling said diode array input to said diode array output.

13. The apparatus of claim 12, wherein the values of said impedances are selected such that the diode array has a linearizing response.

14. An apparatus for linearizing the response of a PIN diode attenuator in a receiver circuit, said receiver circuit including a level detector, said level detector providing a feedback signal, wherein said apparatus comprises:

a plurality of Zener diodes forming a diode array, each of said Zener diodes having the same Zener voltage value, the diode array input being coupled to said feedback signal, a first Zener diode having a cathode coupled to an input of the diode array, a second Zener diode having a cathode coupled to the anode of said first Zener diode, a third Zener diode having a cathode coupled to the anode of said second Zener diode, the anode of each of said first and said second Zener diodes being coupled to a respective impedance, said respective impedances being coupled in common to an output of said diode array, the anode of said third Zener diode being coupled to said output of said diode array, a third impedance being coupled between said diode array output and said diode array input;

an amplifier providing gain and offset, said diode array output being coupled to an input of said amplifier; and a driver providing output drive, an output of said amplifier being coupled to an input of said driver, an output of said driver being used for linearizing the response of a PIN diode attenuator.

15. The apparatus of claim 14, wherein said Zener diodes are selected to have a negative temperature coefficient.

16. The apparatus of claim 15, wherein the values of said impedances are selected such that the diode array has a linearizing response.

* * * * *